(12) United States Patent
Schlenga et al.

(10) Patent No.: US 8,318,639 B2
(45) Date of Patent: Nov. 27, 2012

(54) SUPERCONDUCTING COMPOSITE, PRELIMINARY PRODUCT OF SUPERCONDUCTING COMPOSITE AND METHOD FOR PRODUCING SAME

(75) Inventors: Klaus Schlenga, Linkenheim (DE); Andreas Szulczyk, Lisengericht (DE)

(73) Assignee: Bruker EAS GmbH, Hanau (DE)

( * ) Notice: Subject to any disclaimer, the term of this patent is extended or adjusted under 35 U.S.C. 154(b) by 662 days.

(21) Appl. No.: 12/570,294

(22) Filed: Sep. 30, 2009

(65) Prior Publication Data
US 2010/0093546 A1 Apr. 15, 2010

(30) Foreign Application Priority Data
Sep. 30, 2008 (DE) .......................... 10 2008 049 672

(51) Int. Cl.
*H01F 6/00* (2006.01)
*H01B 12/00* (2006.01)
*H01L 39/00* (2006.01)

(52) U.S. Cl. ....................................................... 505/237

(58) Field of Classification Search .................. 505/230, 505/231, 237; 428/699–702
See application file for complete search history.

(56) References Cited

U.S. PATENT DOCUMENTS

| | | | |
|---|---|---|---|
| 2008/0274901 A1* | 11/2008 | Glowacki et al. | 505/230 |
| 2009/0170710 A1* | 7/2009 | Tanaka et al. | 505/231 |
| 2009/0305897 A1* | 12/2009 | Grasso et al. | 505/232 |
| 2010/0317530 A1* | 12/2010 | Park et al. | 505/231 |

FOREIGN PATENT DOCUMENTS

| | | |
|---|---|---|
| DE | 2331962 A1 | 1/1975 |
| DE | 102 11 538 B4 | 5/2003 |
| DE | 102006020829 A1 | 11/2007 |
| EP | 1569285 A | 8/2005 |
| EP | 1 894 906 A1 | 3/2008 |
| JP | 2007095367 A | 4/2007 |
| JP | 2008066168 A | 3/2008 |

OTHER PUBLICATIONS

Office Action issued by the German Patent and Trademark Office on Mar. 5, 2010 for German Patent Application No. 10 2008 049 672. 3-34.
European Search Report dated Feb. 10, 2010 for European Application No. 09170659.8-2222.
Dergunova E A et al., *Development and Research of the Nb3Sn Superconductor with Improved Structure of Superconductive Layer*, IEEE Transactions on Applied Superconductivity, IEEE Service Center, Los Alamitos, CA, US, Bd. 15, Nr. 2, 1. Jun. 1, 2005, pp. 3407-3409, XP011134350, ISSN: 1051-8223.
Glowacki B A et al., *MgB2 Conductors for dc and ac Applications*, Physica C, North-Holland Publishing, Amsterdam, NL, Bd. 372-376, 1. Aug. 1, 2002, pp. 1235-1240, XP004375651, ISSN: 0921-4534.

(Continued)

*Primary Examiner* — Colleen Dunn
(74) *Attorney, Agent, or Firm* — Buchanan Ingersoll & Rooney PC

(57) ABSTRACT

Disclosed herein are superconducting composites, and preliminary products therefor, having a core comprising a superconducting phase, a first casing surrounding the core, and having an inner area abutting the core and having a first magnesium concentration and an outer area having a second magnesium concentration greater than the first magnesium concentration, wherein the second magnesium concentration is, on average, between 5 and 40 atomic percent. Desirably, the superconducting phase comprises a $MgB_2$ phase. This arrangement allows for methods for producing the composites that reduce or eliminate subjecting the superconducting phase to mechanical stresses.

33 Claims, 4 Drawing Sheets

OTHER PUBLICATIONS

Hancock, M H et al, *Effect on Deformation Process of Adding a Copper Core to Multifilament Superconducting Wire*, IEEE Transactions on Applied Superconductivity, IEEE Service Center, Los Alamitos, CA, US, Bd. 17, Nr. 2, 1. Jun. 1, 2007 pp. 3054-3058, XP011188861, ISSN: 1051-8223.

Tomsic et al., *Development of Magnesium Diboride (MgB2) Wires and Magnets Using in Situ Strand Fabrication Method*, Physica C, North-Holland Publishing, Amsterdam, NL, Bd. 456, Nr. 1-2, Jun. 1, 2007, pp. 203-208 XP022080832, ISSN: 0921-4534.

* cited by examiner

SUPERCONDUCTING COMPOSITE, PRELIMINARY PRODUCT OF SUPERCONDUCTING COMPOSITE AND METHOD FOR PRODUCING SAME

This application claims benefit of the filing date of DE 10 2008 049 672.3, filed Sep. 30, 2008, the entire contents of which are incorporated herein by reference.

BACKGROUND

1. Field

Disclosed herein are to a superconducting composite, a preliminary product of a superconducting composite and method for producing same.

2. Description of Related Art

Various types of superconductors that can be produced on a large scale are known. NbTi alloys and intermetallic $Nb_3Sn$ compounds exhibit a transition temperature $T_c$ of less than 20 K and can be produced in large strands by means of classic shaping methods such as extruding, thermoforming, or rolling. However, the low transition temperature leads to high equipment and cooling costs.

Superconducting copper oxide-based compounds, e.g. YBCO ($T_c$ approximately 92 K), Bi-2212 and Bi-2223 with a transition temperature of approximately 110 K and Tl-2223 ($T_c$ approximately 125 K) are also known. These superconductors are referred to as high-temperature superconductors (HTS"). The electronic properties of the HTS are characterized by the two-dimensional cross-linking of the $CuO_2$ planes. The two-dimensional character of the $CuO_2$ conductor planes is reflected in the extreme anisotropic physical properties. In particular, the critical current density $J_c$ in the conductors is strongly determined by the field direction of a distinctive magnetic field.

The superconducting $MgB_2$ phase and the $MgB_2$-based superconducting phases have a transition temperature of up to 40 K. Compared to the textured, copper-based technical conductors, $MgB_2$ conductors display no distinctive anisotropy of the electrical properties in the distinctive magnetic field.

The disadvantage of the $MgB_2$ phase, however, is that it shows little or no ability to be shaped using the classic shaping methods such as rolling, thermoforming or extruding. Producing large conductor strands with homogenous conductor properties for power engineering by means of classic wire manufacturing methods is not easy.

SUMMARY

Hence, there remains a need to specify a superconductor for the use in magnetic and power engineering as well as a method for its production.

The task is solved by means of a composite as described herein, as well as a method described herein. Advantageous further embodiments are also disclosed herein.

In this connection, a superconductor (for example based on $MgB_2$) is specified in the form of a composite. In a first exemplary embodiment a composite comprises a core comprised of a superconducting $MgB_2$ phase and a first casing surrounding said core. The first casing is comprised of a non-superconducting alloy featuring magnesium and at least one additional metal. An inner area of the first casing surrounding and abutting the core comprises less magnesium than an outer area of the first casing, which surrounds the inner area of the first casing.

In this first embodiment, the composite can comprise one single core, which features at least one superconducting $MgB_2$ phase. The casing contains magnesium, which is also an element of the superconducting $MgB_2$ phase. The inner area of the casing, which directly abuts the core from the superconducting $MgB_2$ material, features less magnesium in this connection than an area that is further removed from the core.

Alternatively, the $MgB_2$ superconducting material in the core may be divided into individual $MgB_2$ filaments embedded in a matrix made of normal-conducting material. In a particular embodiment, this normal-conducting material may be a silver-magnesium alloy. In this alternative, the multifilament core conductor can itself be a composite material comprised of the actual superconducting material, with or without a barrier, a stabilizing material and/or additional components for mechanical reinforcement.

According to an embodiment described herein, the superconducting phase of the core can be formed by a selective diffusion reaction between a core made from boron or from a boric material low in magnesium and the magnesium casing that surrounds the core.

This two-dimensional composition distribution of the first casing is typical for a reaction of two elements and the result of a reaction of two elements that were arranged side by side in two separate areas before the reaction.

In a second exemplary embodiment disclosed herein a preliminary product is provided, from which the composite can be produced based on the first exemplary embodiment.

The preliminary product of the second exemplary embodiment comprises a composite having a core made from boron, or from a boric material low in magnesium and a non-superconducting first casing surrounding the core. The first casing consists of an alloy that comprises magnesium and at least one additional metal.

A "boric material low in magnesium" as used herein means a composition with a lower magnesium content than the stoichiometric composition of the superconducting phase, i.e. 1 Mg:2 B. The boric material low in magnesium may also be free of magnesium.

This preliminary product composite makes it possible to manufacture a long wire or tape before generating the superconducting $MgB_2$ phase inside the core. Hence, the superconducting $MgB_2$ phase is not shaped, since the superconducting phase is only generated at the end of the forming of the wire or tape, i.e., after shaping. After manufacturing the tape or the wire, heat treatment or annealing under a protective gas or under a vacuum is carried out, so that the boron of the core and the magnesium of the casing react with one another chemically. As a result of this reaction the superconducting $MgB_2$ phase is formed inside the core of the composite.

Initially, the wire or the tape may be wound as a coil in the initial state and then annealed to generate the superconducting $MgB_2$ phase inside the core of the coiled wire or tape. The advantage of this method is that the coil needs only little or no further processing after the superconducting phase is produced. Thus, damage to the superconducting phase from such further processing is minimized or avoided.

Further, a cohesive material connection is typically generated between the superconducting phase and the casing. The advantage is that if quenching of the superconductor occurs, the current between the core and the casing can better distribute, thus reducing the risk of damage to the superconducting phase.

In a third exemplary embodiment is disclosed a composite that features a core area that comprises several filaments. In each case, the filaments embody a superconducting $MgB_2$ phase and are surrounded by a first casing made from a non-superconducting alloy. The core area is surrounded by a second casing made from a non-superconducting alloy. The first casing and the second casing desirably feature magnesium and at least one additional metal. As in the first exemplary embodiment, an inner area of the first casing, which surrounds the filaments and abuts the filaments, comprises less magnesium than an outer area of the first casing, which surrounds the inner area of the first casing.

Also disclosed herein are methods for producing the preliminary product composite, and for producing the superconducting composite described herein.

More particularly, in one embodiment is disclosed a method for producing a preliminary product of a superconducting composite as described herein, comprising:

providing a rod comprising boron or a boric material low in magnesium, providing a first casing comprising a non-superconducting alloy that comprises magnesium and at least one additional metal, surrounding the rod with the first casing to form a composite.

More particularly, in one embodiment is disclosed methods for producing a superconducting composite, comprising:

producing the preliminary product of a superconducting composite in accordance with the methods described herein, and annealing the preliminary product at a temperature and for a duration sufficient for boron in the rod comprising boron or a boric material low in magnesium and for the magnesium of the first casing to form a superconducting $MgB_2$ phase.

More particularly, in one embodiment is disclosed a preliminary product of a superconducting composite as described herein, comprising:

a core comprising boron, or a boric material low in magnesium;

a casing surrounding the core, comprising a non-superconducting alloy which comprises magnesium and at least one additional metal;

wherein the average magnesium concentration of the casing is between 5 and 40 atomic percent.

BRIEF DESCRIPTION OF DRAWINGS

The embodiments disclosed herein are described in greater detail below based on the drawings.

DETAILED DESCRIPTION OF SPECIFIC EMBODIMENTS

Figure 1:
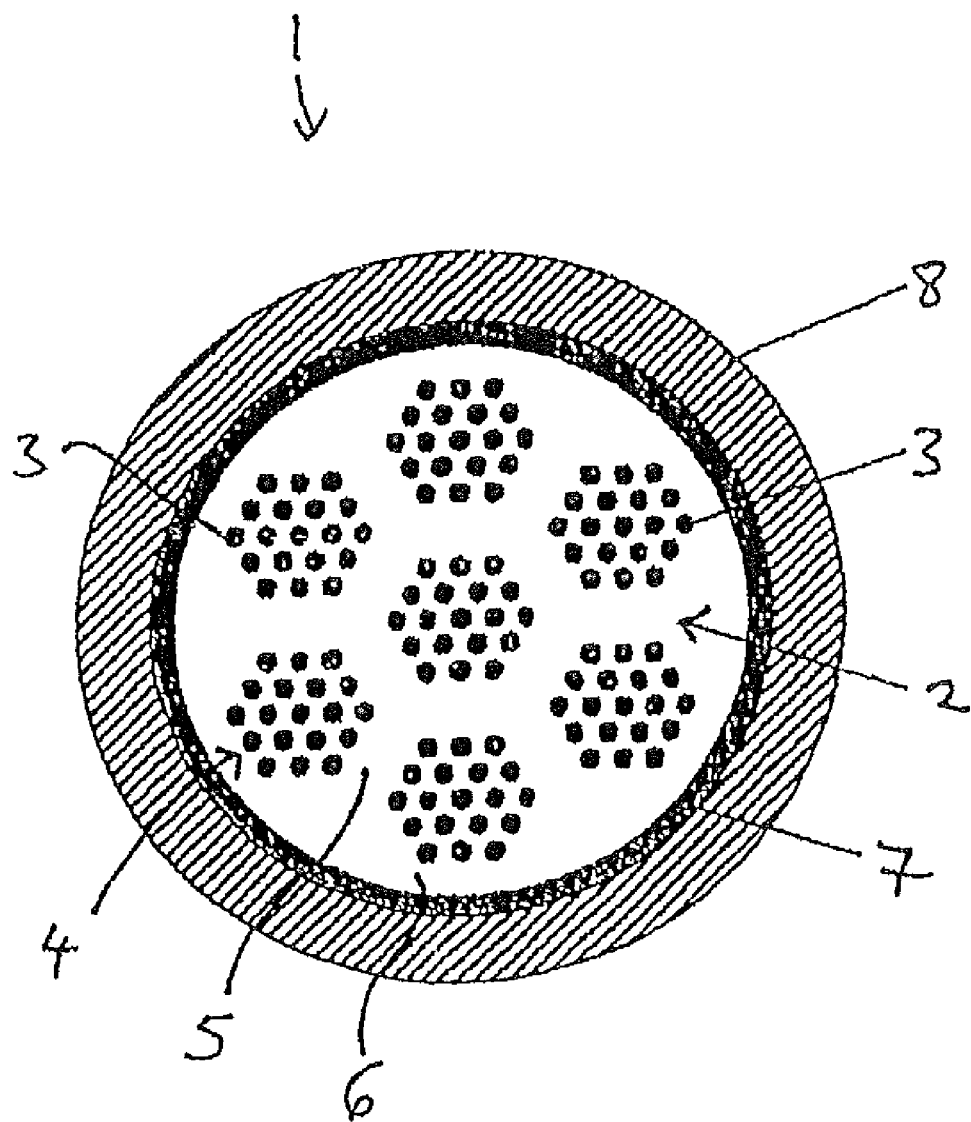
FIG. 1 represents a schematic illustration of a multi-filament composite according to an embodiment described herein.

In certain embodiments, the first casing and the second casing cannot be easily recognized as separate parts inside the composite, e.g., if the materials of the two casings are welded to one another following shaping. Also, the materials of the two casings may fuse due to the heat treatment, so that a boundary between the two cannot be recognized in a microsection, for example.

In this exemplary embodiment, at least a portion of the inner area of the first casing surrounds the respective filaments made of $MgB_2$. The inner area may be comprised of one single area that continuously surrounds the filaments. Alternatively, the inner area may feature several subareas that are separated from one another. In the first exemplary embodiment the outer area of the first casing may include separate areas between the filaments and the inner area may consist of one single area. In a second exemplary embodiment, several ring-shaped inner areas are surrounded by ring-shaped outer areas.

The filaments from a superconducting $MgB_2$ phase are also generated by a reaction between boron from the respective precursor filaments made from boron or from a boric material low in magnesium and magnesium from the magnesium-containing casing that surrounds the filaments. As in the first exemplary embodiment, the two-dimensional distribution of the magnesium content of the first casing constitutes a typical result of a diffusion reaction of two elements that were arranged in large separate areas abutting each other (i.e., side by side) before the reaction.

Also disclosed herein is a preliminary product that can be used to produce a superconducting multi-filament composite according to one of the afore-described exemplary embodiments. This composite features a core area and a first casing. The core area features several filaments made from boron or from a boric material low in magnesium, each of which is surrounded by the first casing made of a non-superconducting alloy. The core area in turn is surrounded by a second casing made of a non-superconducting alloy. The first casing and the second casing consist of magnesium and at least one additional material.

By means of heat treatment, the boron from the filaments (rich in boron and low in magnesium) may react with magnesium from the adjacent first casing (rich in magnesium and low in boron) to form the superconducting $MgB_2$ phase in the filaments.

Advantageously, for electromagnetic stabilization a highly conductive material may be integrated into the composite, which is protected against inward diffusion of Mg by means of a diffusion barrier. The highly conductive material may include Cu or Ag. The diffusion barrier may include one or more of the elements Ta, Nb, V, Hf or Fe.

In a further exemplary embodiment the composite may also feature a mechanical reinforcement according to one of the aforementioned exemplary embodiments, so that the forces that can occur in connection with high current and high magnetic fields do not damage or destroy the composite and/or its superconducting properties.

In the multi-filament composite the mechanical reinforcement may be embodied as a reinforced barrier (for example Ta) having a cross-sectional area (i.e., an area of the annular ring created by the cross-section) of up to 20% of the area of the total cross-section.

In a further exemplary embodiment, the mechanical reinforcement has the shape of one or several rods. This embodiment of the mechanical stabilizing element is typically used in connection with a multi-filament composite. The mechanical stabilizing rods, can be for example, arranged in the core area and also surrounded by the first casing. The stabilizing rod or rods may have the same diameter as the filaments and may be arranged at regular intervals in the filament pattern, for example axially symmetrical. The mechanical reinforcement rods may for example show an axial symmetrical arrangement in the filament pattern in order to distribute the mechanical stabilization effect or reinforcement more equally over the cross-section of the composite.

The mechanical reinforcement in the form of rods may, instead of a stabilizing element, be realized in the form of an outer casing. In a further exemplary embodiment the composite features a mechanical reinforcement in the outer casing as well as several mechanical stabilizing rods in the core area.

Also in the case of reinforcement rods a diffusion barrier may be arranged between the respective reinforcement rods and the first casing, in which they are embedded. The diffusion barrier of the rods may also have the shape of a pipe.

The thickness of the diffusion barrier may be increased to raise the ratio of the cross-sectional area of the barrier with respect to the overall cross-section area of the composite. In one exemplary embodiment the ratio of the cross-sectional area of the diffusion barrier amounts to 3.5% to 20% of the area of the overall cross-section of the composite.

Similarly, the portion of the highly conductive material for electromagnetic stabilization may be adjusted. In one exemplary embodiment the ratio of the cross-sectional area of the electromagnetic stabilization material ranges between 15% and 50% of the overall cross-sectional area of the composite. This portion may be adjusted through the thickness of the stabilizing element and/or the number of stabilizing rods and/or the composition of the stabilizing elements.

The composites according to the invention typically have the shape of an elongated body. To this end, the composite may for example be a wire or a tape. In this connection, a "wire" is characterized as an elongated body with a roughly circular or elliptical cross-section and a "tape" as an elongated body with a roughly square or rectangular cross-section.

In one exemplary embodiment of the preliminary product composite the magnesium concentration of the first casing ranges between 5 atomic percent and 40 atomic percent before generating the superconducting phase. After generating the superconducting phase, the magnesium average concentration of the outer area of the first casing may range between 5 atomic percent and 40 atomic percent. After generating the superconducting $MgB_2$ phase the magnesium content of the inner casing is lower than before generating the superconducting $MgB_2$ phase.

The magnesium content of the first casing of the preliminary product composite may further be chosen such that the casing may be shaped by means of shaping methods, such as thermoforming and rolling, without crack formation or tearing.

The magnesium concentration may also be chosen such that sufficient magnesium is present to generate the superconducting phase from the magnesium of at least the inner area of the first casing and from the boron of the core. This ratio may also be set by the additional measure, which is that the ratio between the cross-sectional area of the first (magnesium-containing) casing and the cross-sectional area of the core is regulated. In one exemplary embodiment this ratio ranges between 0.5 and 2.

The first casing, and in case of a multi-filament composite, also the second casing, may be comprised of a silver-magnesium alloy, with the magnesium average concentration ranging between 5 atomic percent and 40 atomic percent.

In the case of one superconducting composite, the surface distribution of the elements of the first casing may characterize the reaction type of the superconducting phase formation. According to the embodiments described herein, the superconducting $MgB_2$ phase is generated by the reaction of boron from the core—rich in boron and low in magnesium—with magnesium from the abutting casing—rich in magnesium and low in boron. Hence, after this reaction the magnesium concentration of the first casing as a function of position decreases from the outer area toward the core. The profile of the magnesium concentration may typically be that of a diffusion profile, i.e., a concentration profile that would be expected to result from diffusion of magnesium from the first casing into the core.

Desirably, the average magnesium concentration of the inner area of the first casing (i.e. the region where concentration follows a diffusion profile) ranges between 2 and 10 atomic percent.

In a further exemplary embodiment of a multi-filament composite, the second casing, which surrounds the first casing, contains a greater magnesium concentration than the first casing. The first casing thus shows a lower magnesium concentration than the second casing. This may be the result of the reaction of the magnesium of the first casing with the boric core.

In a further exemplary embodiment of a multi-filament composite, an inner area of the first casing, which surrounds the respective filaments and abuts the filaments, contains less magnesium than an outer area of the first casing, which surrounds the inner area of the first casing. The magnesium concentration may also diminish from the outer area to the core and exhibit a diffusion profile.

Also described herein are methods for producing a superconducting composite as well as methods for producing a preliminary product that can be used to produce a superconducting composite.

According to an embodiment described herein, one method for producing a composite comprises providing a rod comprised of boron or a boric material low in magnesium and a first casing made from a non-superconducting alloy, e.g., which contains magnesium and at least one additional metal. The rod is surrounded with the first casing and a composite is formed. This composite may serve as a preliminary product of a superconducting composite with a single core as well as for producing a multi-filament composite.

As already mentioned hereinabove, the first casing may include silver and magnesium and/or the magnesium average concentration in the first casing may range between 5 atomic percent and 40 atomic percent.

After surrounding the rod containing boron, or a boric material low in magnesium, with the first casing, the composite is, for example, shaped by reducing the cross-section of the composite without cutting. This way, the length of the composite is increased. Simultaneously, for example, the density of the rod can be increased. The composite may be shaped without cutting by beating, extruding, thermoforming or rolling, or by combinations of two or more of these methods. The result of some or all of the steps recited above is a preliminary product composite as described herein.

To produce a superconducting composite from such a preliminary product according to one of the afore-described exemplary embodiments, the composite is annealed at a certain temperature and for a certain length of time. The temperature and the length of time of the annealing are chosen such that the rod containing boron, or a boric material low in magnesium, and the magnesium of the first casing, form a superconducting $MgB_2$ phase.

There are several possible ways of surrounding the rod comprised of boron or a boric material low in magnesium with the first casing. The rod may, for example, be inserted into a pipe made of the desired non-superconducting alloy, with the latter consisting of magnesium and at least one additional metal. Alternatively, the rod may be wrapped in a foil. In this embodiment, the foil forms a jacket that may be comprised of several layers.

In yet another embodiment, a bore hole may also first be drilled into a body element made of a non-superconducting alloy, e.g., a body element that features magnesium and at least one additional metal. Subsequently, a rod comprised of boron or of a boric material low in magnesium is inserted into the bore hole.

Also described herein are methods for producing multi-filament composites. These multi-filament composites may be a preliminary product or a superconducting composite.

In a first exemplary embodiment in this regard, several composites are produced, each of which feature at least one core comprised of boron or of a boric material low in magnesium and a first casing. A composite according to one the aforementioned exemplary embodiments may be used. These composites are arranged in one bundle, which is encased with a second casing. This composite may be further processed. This composite may for example be shaped without cutting to increase the length of the composite and simultaneously reduce the cross-section, as described above.

Alternatively, to produce a multi-filament composite several bore holes may initially be drilled into a body element comprised of a non-superconducting alloy. The body element consists of magnesium and at least one additional metal. Subsequently, a rod comprised of boron or of a boric material low in magnesium is inserted into the respective bore holes, which produces a multi-filament composite.

In a more particular embodiment, a rod comprised of a stabilizing material may for example also be inserted into at least one of the bore holes. Rods comprised of boron or of a boric material low in magnesium are inserted into the remaining bore holes.

Also, after producing a multi-filament composite according to one of the aforementioned exemplary embodiments, the multi-filament composite may be shaped without cutting by reducing the cross-section of the multi-filament composite.

The multi-filament preliminary product produced as described above may also be used to form a superconducting composite. To this end, the multi-filament preliminary product is annealed at a certain temperature and over a certain length of time, both of which are sufficient for the boron in the rod comprised of boron or of a boric material low in magnesium and for the magnesium of the first casing to diffuse and react to form a superconducting $MgB_2$ phase in the core of the superconducting composite.

In a particular embodiment, the multi-filament composite may be provided with a stabilizing element in the form of an outer casing. The outer casing may be designed as a pipe or tube, into which the multi-filament composite is inserted. According to this step the composite may also be shaped without cutting.

To produce a multi-filament composite with mechanical stabilizing elements in the form of rods, the stabilizing rods along with additional composites can be combined with a core comprised of boron or a boric core.

If the composite is to feature a diffusion barrier, the latter can desirably be inserted between the stabilizing element (e.g., the outer casing) and the second casing. The second casing is first enclosed by the diffusion barrier, and then the diffusion barrier enclosed by the third casing.

The diffusion barrier for example, can be designed in the form of a pipe or tube. In this process, the second casing is first surrounded with a diffusion barrier pipe or tube, and then the diffusion barrier pipe or tube is surrounded with the stabilizing element.

The composite is made into the shape of a wire or a tape through shaping without cutting. Shaping without cutting is, for example, desirably carried out before generating the superconducting phase. The advantage of this sequence is that no pressure is put on the superconducting $MgB_2$ phase due to the deforming process and the risk of cracks in the superconducting material is reduced.

The wire or the tape may be wound into a coil, either before or after generating the superconducting phase. The advantage of winding after generating the superconducting phase is that insulating material arranged between the electrically conducting windings is not heated by the annealing step. Hence, insulating the windings is easier and the selection of insulating material more comprehensive.

The advantage of winding a composite with a non-superconducting phase or a preliminary product is that no mechanical stress is put on the superconducting phase, since the superconducting phase is only formed after the winding. As a result, the formation of cracks in the superconducting filaments is mostly avoided.

FIG. 1 shows a schematic illustration of an exemplary embodiment of a cross-section of a multi-filament composite 1. The multi-filament composite comprises a core area 2, in which several filaments 3 are embedded. The filaments 3 are arranged in seven groups 4, with the filaments 3 of the respective groups 4 as well as the seven groups 4 arranged in a hexagonal pattern. The filaments 3 are surrounded by a first casing 5, also referred to as a matrix, since all filaments 3 have been embedded in the first casing 5. The first casing 5 is surrounded by a second casing 6. The first casing 5 and the second casing 6 are illustrated in more detail in the FIGS. 2 and 3.

In this exemplary embodiment the multi-filament composite 1 comprises a diffusion barrier 7 in the form of a pipe, which surrounds the second casing 6. The diffusion barrier 7 essentially consists of tantalum or niobium. The composite 1 is surrounded by a tubular outer casing 8 made of copper, which acts as a stabilizing element. The outer contour of the composite 1 is roughly circular. The outer contour, however, could also be roughly square.

The composite 1 of FIG. 1 comprises no super-conducting phase and represents a preliminary product, which may be used to produce a super-conducting composite with a super-conducting $MgB_2$ phase.

Figure 2:
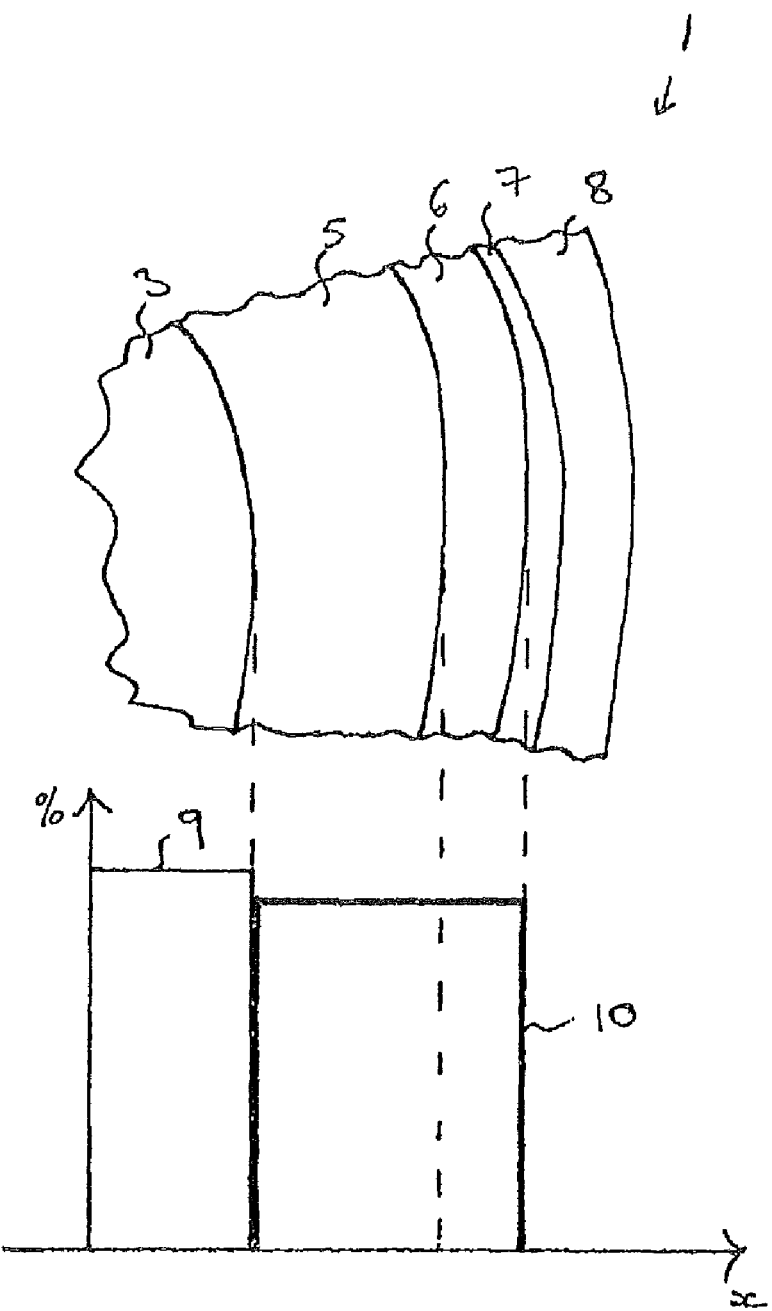
FIG. 2 represents a schematic illustration of a filament of the composite of FIG. 1 before generating the superconducting phase.

FIG. 2 is a schematic diagram that shows a cut-out of a filament 3 as well as of the first casing 5, of the second casing 6, of the diffusion barrier 7 and of the outer casing 8 of the multi-filament composite 1 of FIG. 1. The graph corresponding to the cross-section of the multi-filament composite 1 shows the concentration of the boron in filament 3, and the concentration of the magnesium in the first casing 5 as well as in the second casing 6.

In the embodiment illustrated is FIG. 2, filament 3 is essentially comprised of boron and the first casing 5 consists of a silver-magnesium alloy with 20 atomic percent of magnesium. Thus, filament 3 is essentially free of magnesium and the first casing 5 is essentially free of boron. Thus, the two elements of the super-conducting $MgB_2$ phase to be formed are spatially arranged side by side in the preliminary product. The positional distributions of the B and Mg concentrations in this arrangement is illustrated by lines 9 and 10 in FIG. 2.

Line 9 shows the boron concentration of composite 1 in the x direction and shows that boron is only contained in the filament 3. Line 10 shows the magnesium concentration of composite 1 in x direction, with magnesium only contained in the first casing 5 and in the second casing 6. Thus, the two elements that react to form the super-conducting $MgB_2$ phase are arranged side by side in the preliminary product composite.

Figure 3:
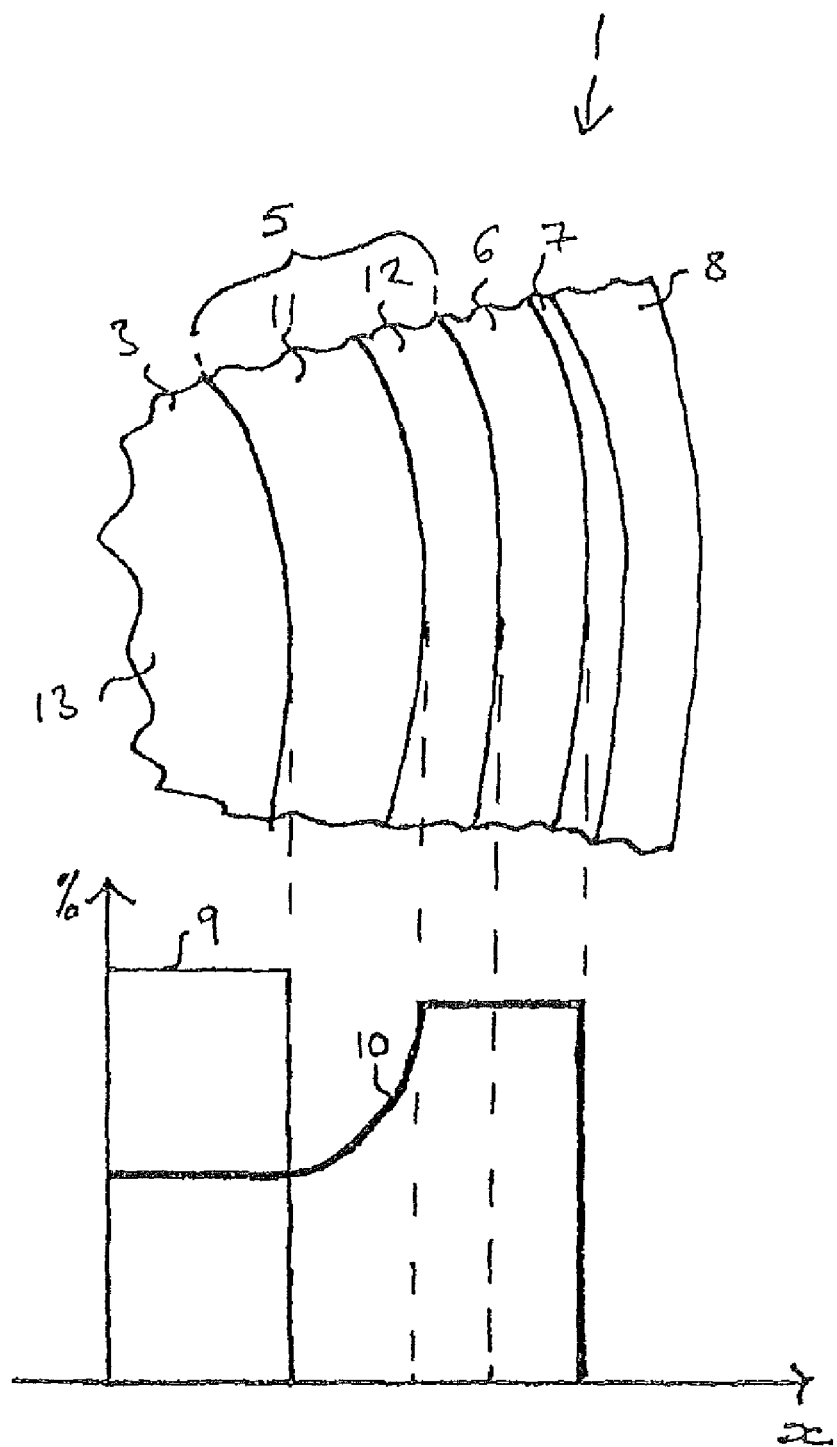
FIG. 3 represents a schematic illustration of a filament of the composite of FIG. 1 after generating the superconducting phase.

FIG. 3 is a schematic diagram that shows the cross-sections and concentration profiles of composite 1 of FIG. 2 following heat treatment. The conditions of the heat treatment are chosen such that the $MgB_2$ phase forms in the boric filaments 3 through diffusion reactions of Mg from the magnesium containing casing 5, which surrounds the filaments 3. This is graphically shown in FIG. 3 by the lines 9 and 10.

Line 9 shows that boron is only contained in filament 3. Line 10 shows that magnesium is not only contained in the first casing 5 and in the second casing 6, but also in filament 3.

In contrast to the preliminary product composite of FIG. 2, filament 3 comprises magnesium as well as boron in the ratio $MgB_2$ following heat treatment, and is thus superconducting. The first casing 5 has now two areas 11, 12 with a different content of magnesium. The inner area 11 abuts the filament 3 and contains less magnesium than the outer area 12, which surrounds the inner area 11. A comparison of FIGS. 2 and 3 shows that the magnesium content of the inner area 11 is lower than the magnesium content of the region corresponding to inner area 11 in the preliminary product composite.

The magnesium content of the first casing decreases from the edge of second area 12 to the filament 3. The superconducting $MgB_2$ phase 13 is formed from the magnesium of the first casing 5, which diffuses to the filament core 3 and reacts there chemically with the boron of the filament 3. Due to this mode of reaction the distribution of the magnesium in the inner area 11 of the first casing shows a diffusion profile. The second area 12 features a magnesium portion that roughly corresponds to the magnesium content of the second casing 6 in this exemplary embodiment.

Figure 4:
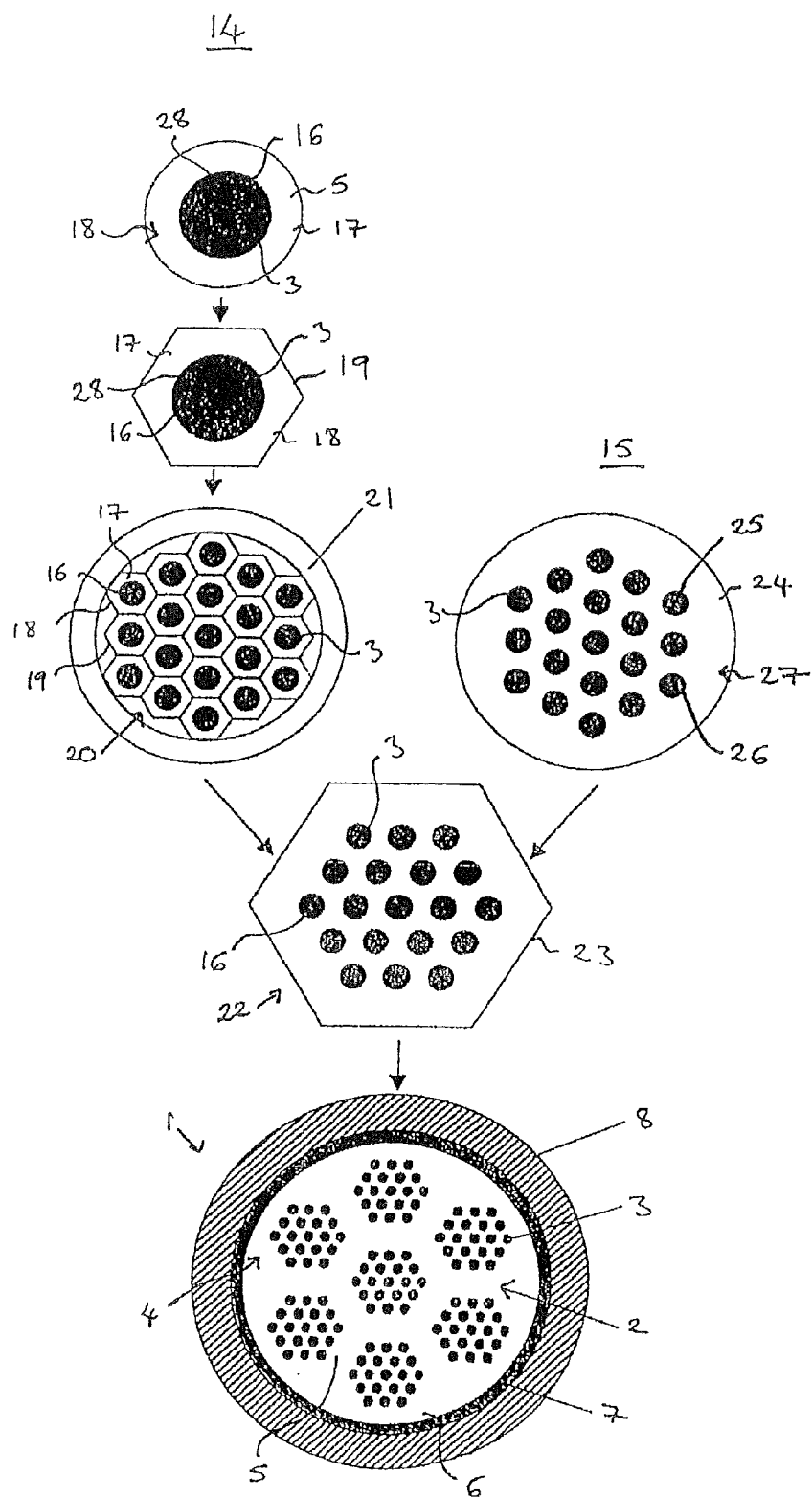
FIG. 4 represents a schematic illustration of two methods for producing a multi-filament composite by means of the arrangement of FIG. 1.

FIG. 4 is a schematic diagram that shows a graphic presentation of two methods 14, 15 for producing a multi-filament composite 1 on the basis of the arrangement of FIG. 1.

In a first exemplary embodiment, in a method 14, a rod 16 made from boron is first inserted into a pipe 17 with a circular cross-section made of a silver-magnesium alloy with 10 atomic percent of magnesium. This arrangement is shaped by reducing the cross-section and elongating. This is accomplished through thermoforming and beating with possible intermediate annealing to produce a composite 18 with a single core 28 and a first casing 5. It should be noted that the sizes of the various products of this process are not to scale, but are, in some cases, enlarged for ease of understanding.

In one exemplary embodiment the composite 18 serves as a finished product, if a composite with a single core 28, i.e. a mono-conductor, is desired. In this embodiment composite 18 is heated, so that the boron of the core 28 reacts chemically with the magnesium of the first casing 5 and the super-conducting $MgB_2$ is generated in the core 28. The two-dimensional distribution of the boron concentration as well as of the magnesium concentration corresponds to the distribution in connection with the multi-filament composite 1, which is graphically illustrated in FIG. 3. The casing 5 features an inner area 11 not shown in FIG. 4, which contains less magnesium than an outer area 12, also not shown in FIG. 4.

In a further embodiment illustrated in FIG. 4, the composite 18 can serve as an intermediary product in the production of a multi-filament composite 22. This method is shown by the additional steps of method 14 illustrated in FIG. 4.

To produce a multi-filament composite 22 several composites 18 are manufactured and the outer contours of the composites 18 are brought into a hexagonal form 19. This outer form has the advantage that the composites 18 can be assembled into bundle 20 with no or few gaps between the adjacent composites which gaps can be filled with shaped profiles of a silver-magnesium alloy, for example. This bundle 20 will be described in the next step.

The bundle 20 as illustrated, is comprised of nineteen hexagonal composites 18, which are inserted into an additional casing 21 and shaped by reducing the cross-section to form the multi-filament composite 22 with nineteen filaments 3 (following annealing) made of boron. Each rod 16 provides for a filament 3 in the multi-filament composite 22. This multi-filament composite 22 can also serve as a finished product with nineteen filaments 3 or may be further processed to further increase the number of filaments 3 as in the multi-filament composite 1 of FIG. 1.

To form the composite 1, seven composites 22, each comprising nineteen filaments 3 and a hexagonal outer contour 23, are combined, and the empty space between the hexagonal bundling and the inner radius of the diffusion barrier 7 is filled with profiles made of a silver-magnesium alloy adjusted to width across flats.

The bundle is then surrounded by the diffusion barrier 7 and then by the outer casing 8 for mechanical stabilizing and further shaped to form a preliminary product of a multi-filament composite 1 comprising seven groups 4 with nineteen filaments 3 made of boron. Subsequently, the composite 1 is annealed to generate the super-conducting $MgB_2$ phase 13 in the filaments 3. The two-dimensional distribution of the magnesium in the first casing 5 corresponds to the magnesium distribution shown in FIG. 1.

An alternative exemplary embodiment for producing the multi-filament composite 1 is method 15, which is also graphically illustrated in FIG. 4. A cylinder body 24 comprised of a silver-magnesium alloy with a magnesium content of 25 atomic percent is first provided and several bores 25 are drilled into the cylinder body 24. The arrangement of the bores 25 corresponds to the hexagonal pattern of composite 22 of method 14.

Rods 26 comprised of boron or a boric material are inserted into these bores 25 to produce a composite 27 with nineteen filaments 3. The composite 27 is then shaped without cutting by reducing of the cross-section and elongating. This composite 27 may also serve as a finished product after annealing.

In a further exemplary embodiment several of these composites 27 are provided with a hexagonal outer contour 23 and assembled into a bundle. As already described hereinabove, the bundle is surrounded with a diffusion barrier 7 and a mechanical stabilizing casing 8 and further shaped to produce the multi-filament composite 1. The multi-filament composite 1 is subjected to heat treatment or annealing to generate a super-conducting $MgB_2$ phase 13 in the filaments 3, as illustrated in FIG. 3.

In a further exemplary embodiment of a multi-filament composite—not shown in the drawings—the mechanical stabilization is achieved through several mechanical stabilizing rods, which have the size of the filaments made of boron. In method 14 and in method 15 the mechanical stabilizing rods replace some filaments comprised of boron in the bundle 20. The mechanical stabilizing rods may desirably be arranged in an axially symmetrical pattern in bundle 20 in order to more equally distribute the stabilizing effect over the composite cross-section. The multi-filament composite may comprise not only stabilizing rods in the core area, but also an additional stabilizing element in the form of an outer casing.

In a further exemplary embodiment (not illustrated in the drawings), molded rods comprised of amorphous boric powder are produced by means of compression at 1,000 bar. These molded rods have a diameter of 15 mm and a length of 100 mm. A molded rod is inserted into a pipe made of a silver-magnesium alloy with 20 atomic percent magnesium concentration and having an inner diameter of 16 mm, an outer diameter of 24 mm and a length of 2,000 mm. One pipe end is welded to a sealing end made of silver under protective gas in an orbital manner. A pump out seal is welded in at the other end.

The mono-conductor is baked out under a protective gas at temperatures of 300° C. up to 600° C. and pumped out. After baking out and squeezing out the suction pipe, the mono-conductor is shaped into core conductors and pre-conductors through beating and thermoforming with alternating heat treatment for the production of a composite 1 according to FIG. 1. At a filament diameter of 151 µm in the finished conductor the super-conducting $MgB_2$ phase is formed from the boron of the filaments and the magnesium of the matrix by means of diffusion annealing with time and temperature ramps between 500° C. and up to 800° C. in a protective gas atmosphere or vacuum.

In a further exemplary embodiment, a mold for a pre-conductor is drilled from a silver-magnesium alloy with 25 atomic percent of magnesium with 19 deep holes. The hole pattern is set such that the ratio between the cross-sectional area occupied by the metal and the cross-sectional area occupied by holes ranges from 1-3 in the region of the first casing, and the ratio of the total cross-sectional area occupied by metal and that occupied by holes amounts to approximately 2-5, e.g., approximately 3. Boron is introduced into the holes, so that the local area ratio between metal and boron ranges from 1-3, and the ratio of the total area between metal and boron is around 2-5, e.g., approximately 3.

This composite body is adjusted to the desired width across flats. Seven molded pre-conductor rods are combined in a bundle pattern of 7×19. The bundle thus has 133 filaments comprised of boron or $MgB_2$, depending upon whether annealing has occurred.

A diffusion barrier comprised of tantalum amounting to 6% of the overall cross-sectional area and a mechanical stabilization pipe or tube made of copper with a cross-sectional area of 23% of the overall cross-sectional area, are provided. Bake-out treatment at a temperature of up to 350° C. is carried out. In a different exemplary embodiment the bake-out treatment may be omitted.

The composite comprising the diffusion barrier and the mechanical stabilizing pipe is formed into a shaped wire with a diameter of 1.5 mm to 2 mm by means of beating, thermoforming and rolling with intermediate heat treatments. The filament diameter is roughly 64 µm.

The wire is then annealed with time and temperature ramps between 600° C. and 750° C. to generate a diffusion reaction between the magnesium of the matrix and the boron of the filaments. The boron filaments are converted from the matrix into the super-conducting phase $MgB_2$ due to the diffusion of the magnesium.

The invention having been described with reference to certain specific embodiments and examples, it will be apparent that these are not limiting of the appended claims.

The invention claimed is:

1. A superconducting composite, comprising:
a core comprising a super-conducting phase, and
a first casing surrounding the core, comprising:
a non-super-conducting alloy, which comprises magnesium and at least one additional metal,
an inner area which surrounds the core and abuts it, and having a first magnesium concentration,
an outer area which surrounds the inner area of the first casing, and having a second magnesium concentration greater than the first concentration, wherein the second magnesium concentration is, on average, between 5 and 40 atomic percent.

2. A superconducting composite comprising:
a core area comprising
a plurality of filaments, wherein the filaments each comprise a super-conducting phase, and
a first casing comprising a non-superconducting alloy surrounding each filament, and
a second casing surrounding the core area and comprising a non-superconducting alloy,
wherein the first casing and the second casing comprise magnesium and at least one additional metal,
wherein the first casing comprises an inner area, which surrounds the filaments and abuts the filaments, having a first magnesium concentration, and an outer area, which surrounds the inner area of the first casing, and having a second magnesium concentration greater than the first magnesium concentration, wherein the second magnesium concentration is, on average, between 5 and 40 atomic percent.

3. The superconducting composite in accordance with claim 2, wherein the filaments comprise boron, or a boric material low in magnesium.

4. The superconducting composite in accordance with claim 1, wherein the superconducting phase comprises a $MgB_2$ phase.

5. The superconducting composite in accordance with claim 2 further comprising one or more stabilizing elements.

6. The superconducting composite in accordance with claim 5, wherein the stabilizing elements comprise a third casing.

7. The superconducting composite in accordance with claim 6, further comprising a diffusion barrier disposed between the third casing and the first casing.

8. The superconducting composite in accordance with claim 7, wherein the diffusion barrier is disposed between the third casing and the second casing.

9. The superconducting composite in accordance with claim 5, wherein the stabilizing element comprises one or more rods surrounded by the first casing.

10. The superconducting composite in accordance with claim 7, wherein the diffusion barrier comprises one or more of the elements Nb, Ta or V.

11. The superconducting composite in accordance with claim 7, wherein the ratio of the cross-sectional area occupied by the diffusion barrier to the overall cross-sectional area of the composite is from 3% to 20%.

12. The superconducting composite in accordance with claim 5, wherein the stabilizing element comprises copper or silver.

13. The superconducting composite in accordance with claim 5, wherein the ratio of the cross-sectional area occupied by the stabilizing element to the overall cross-sectional area of the composite is from 15% to 50%.

14. The superconducting composite in accordance with claim 2, wherein the composite has the shape of a wire or a tape.

15. The superconducting composite in accordance with claim 1, wherein the first magnesium concentration in the inner area decreases from the outer area in the direction of the core and fits a diffusion profile.

16. The superconducting composite in accordance with claim 2, wherein the ratio of the cross-sectional area occupied by the first casing to the cross-sectional area occupied by the core to that occupied by an individual filament ranges between 0.5 and 2.

17. The superconducting composite in accordance with claim 1, wherein the first casing comprises silver and magnesium.

18. The superconducting composite in accordance with claim 2, wherein the second casing comprises silver or magnesium.

19. The superconducting composite in accordance with claim 18, wherein the first casing comprises less magnesium than the second casing overall.

20. A method for producing a preliminary product of a superconducting composite in accordance with claim 1, comprising:
   providing a rod comprising boron or a boric material low in magnesium,
   providing a first casing comprising a non-superconducting alloy that comprises magnesium and at least one additional metal,
   surrounding the rod with the first casing to form a composite.

21. The method in accordance with claim 20, further comprising shaping the preliminary product by reducing the cross-section of the preliminary product without cutting.

22. A method for producing a superconducting composite, comprising:
   producing the preliminary product of a superconducting composite in accordance with claim 20, and
   annealing the preliminary product at a temperature and for a duration sufficient for boron in the rod comprising boron or a boric material low in magnesium and for the magnesium of the first casing to form a superconducting $MgB_2$ phase.

23. The method in accordance with claim 20, wherein the first casing comprises a pipe or tube comprised of a non-superconducting alloy, which contains magnesium and at least one additional metal, and surrounds the rod.

24. The method in accordance with claim 20, wherein providing the first casing comprises drilling several bore holes into a body element made of a non-superconducting alloy, which comprises magnesium and at least one additional metal, and wherein the surrounding the rod with the first casing comprises introducing a rod comprised of boron or a boric material low in magnesium into at least one bore hole.

25. The method in accordance with claim 20, further comprising bundling a plurality of preliminary products into a bundle, and surrounding the bundle with a second casing, to produce a multi-filament preliminary product.

26. The method in accordance with claim 24, wherein a plurality of rods comprised of boron or a boric material low in magnesium are introduced into a plurality of respective bore holes, to produce a multi-filament preliminary product.

27. The method in accordance with claim 25, further comprising shaping the multi-filament preliminary product without cutting by reducing the cross-section of the multi-filament preliminary product.

28. A method for producing a superconducting composite, comprising:
   producing a multifilament preliminary product in accordance with claim 25;
   annealing the multifilament preliminary product at a temperature and for a duration sufficient to develop a superconducting $MgB_2$ phase in at least one rod by the reaction of boron with magnesium from the first casing.

29. The method in accordance with claim 25, further comprising surrounding the multifilament preliminary product with a stabilizing element in the form of a third casing.

30. The method in accordance with claim 20, further comprising:
   introducing stabilizing elements in the shape of rods along with the rods made of boron or a boric material low in magnesium,
   surrounding the rod and the first casing with a second casing;
   surrounding the second casing with a third casing;
   introducing a diffusion barrier between the third casing and the second casing, wherein the diffusion barrier has the form of a pipe or tube.

31. A preliminary product of a superconducting composite, comprising:
   a core comprising boron, or a boric material low in magnesium;
   a casing surrounding the core, comprising a non-superconducting alloy which comprises magnesium and at least one additional metal;
   wherein the average magnesium concentration of the casing is between 5 and 40 atomic percent.

32. The preliminary product of a superconducting composite in accordance with claim 31, wherein the core is a single filament.

33. The preliminary product of a superconducting composite in accordance with claim 31, wherein the core comprises multiple filaments.

* * * * *